US005837995A

United States Patent [19]

Chow et al.

[11] Patent Number: 5,837,995

[45] Date of Patent: Nov. 17, 1998

[54] WAVELENGTH-CONTROLLABLE VOLTAGE-PHASE PHOTODIODE OPTOELECTRONIC SWITCH ("OPSISTOR")

[75] Inventors: Alan Y. Chow, 191 Palomino Pl., Wheaton, Ill. 60187; Vincent Y. Chow, Hanover Park, Ill.

[73] Assignee: Alan Y. Chow, Wheaton, Ill.

[21] Appl. No.: 755,729

[22] Filed: Nov. 25, 1996

[51] Int. Cl.[6] .................................................. H01J 40/14

[52] U.S. Cl. ................................ 250/214 LS; 250/214.1; 250/551; 257/433

[58] Field of Search .......................... 250/214 LS, 214.1, 250/214 R, 214 SW, 551; 257/84, 80, 432, 433; 327/514–517, 521

[56] References Cited

U.S. PATENT DOCUMENTS

| | | | |
|---|---|---|---|
| 4,001,867 | 1/1977 | Kravitz et al. . | |
| 4,873,448 | 10/1989 | Shirai | 250/551 |
| 5,130,528 | 7/1992 | Phillips, Jr. | 250/214 LS |
| 5,130,776 | 7/1992 | Popovic et al. | 257/461 |
| 5,223,728 | 6/1993 | Gempe | 257/290 |
| 5,256,882 | 10/1993 | Miyasaka | 250/551 |
| 5,338,991 | 8/1994 | Lu . | |
| 5,351,309 | 9/1994 | Lee et al. | 250/208.1 |
| 5,491,349 | 2/1996 | Komoto et al. | 257/88 |
| 5,711,201 | 1/1998 | Thompson | 83/856 |

FOREIGN PATENT DOCUMENTS

| | | |
|---|---|---|
| 0084621 | 11/1982 | European Pat. Off. . |
| 0501904 | 2/1992 | European Pat. Off. . |
| 9639221 | 12/1996 | European Pat. Off. . |

*Primary Examiner*—Que Le
*Attorney, Agent, or Firm*—Mayer, Brown & Platt

[57] ABSTRACT

A wavelength-portion controllable optoelectronic switch ("Opsistor") capable of rapid switch frequencies fabricated as a monolithic integrated circuit is disclosed. The Opsistor is comprised of two inverse parallel photodiodes in close proximity, preferably on a monolithic silicon substrate, such that the anode of one photodiode is electrically connected via a first conductor to the cathode of the second photodiode, and the cathode of the first photodiode is electrically connected via a second conductor to the anode of the second photodiode. The voltage-phase of the Opsistor is determined by the relative illumination to the Opsistor's two photodiodes and is rapidly switchable. As a receiving device for data signals, the Opsistor receives programming signals from a transmitter light source. By using different wavelength-portion bandwidth pass filters on each of the two Opsistor photodiodes, a OPS-F device is created, and by using a two-wavelength transmitter light source designated as TM2, a TM2/OPS-F system is created capable of high data transmission rates, and high resistance to signal noise. Applications suitable for the Opsistor and TM2/OPS-F system include high speed optocouplers, linear optical position sensors, edge and target detection sensors, image recognition sensors, the basic subunits of optically based state computers, and high resolution optical encoders.

19 Claims, 6 Drawing Sheets

40 38 44 33 35 46 30 32 34 38 42

WAVELENGTH-CONTROLLABLE VOLTAGE-PHASE PHOTODIODE OPTOELECTRONIC SWITCH ("OPSISTOR")

BACKGROUND OF THE INVENTION

This invention relates in general to a voltage-phase optoelectronic switch (referred to as an "opsistor"), and in particular to a wavelength-controllable opsistor (referred to as an "OPS-F") fabricated as a monolithic integrated circuit with capabilities of extremely rapid switch frequencies, high resistance to external noise and interference, precise optical position sensing, and long-distance signal sensing. This invention also relates to several applications of the opsistor and OPS-F of this invention including long-distance open-air data transmission devices; high-speed fiber optic data transmission devices; the basic logic and/or memory unit of a hybrid optoelectronic based state machine; high resolution optical encoders; and sensitive edge and target sensors that are useful for image and pattern recognition applications; information transfer devices when a physical electrical interconnect is not practical such as to and from moving devices. Many other optical switch applications may benefit from the opsistor.

Previously, optical switches were typically based on optosensors consisting of a single photodiode, phototransistor, photodarlington, and the like are two-state, current-driven devices that have an "on" or "off" current state. For applications such as optocouplers and optoisolators, these devices responded to an "on" or "off" pre-couple signal with a corresponding "on" or "off" post-couple current-signal. The inherent speed of such devices was limited by the rate at which they could switch their currents "on" and "off," the limiting factor often being the passive return-to-ground period. Also for an "on" current state to be recognized, the current had to be at a significantly greater amplitude than background noise. However, the higher the signal current that was needed to generate this recognition, the longer it would take for the switch device to generate that current level, and the even longer period before the switch device would return to the ground level. These characteristics of previous optoelectronic switches results in relatively slow switching speeds of usually less than 1 MHz for a standard photodiode, and even slower speeds for more complicated devices such as phototransistors.

Although optoelectronic switches can be designed to respond with faster switch frequencies by using special circuitry, the additional components of such circuitry increase the complexity and cost of such devices. Further, the transmitter and receiving elements of fast optoelectronic switches have to be in close proximity, usually in a single package, for efficient function and to minimize extraneous light interference.

SUMMARY OF THE INVENTION

One aspect of the present invention (the "opsistor") that addresses the limitations of prior optical switches is the use of active voltage-phase shifts to signal switch events. Another aspect of the present invention is a new wavelength-controllable opsistor that allows voltage-phase switch events of the opsistor to be controlled by light. In its most basic form, the opsistor is comprised of two inverse parallel photodiodes in close proximity (preferably disposed close together on a monolithic substrate) such that the anode of the first photodiode is electrically connected via a first conductor to the cathode of the second photodiode, and the cathode of the first photodiode is electrically connected via a second conductor to the anode of the second photodiode. The voltage-phase of the opsistor (positive or negative) is signal controlled by relative illumination changes to the two photodiodes and is rapidly switchable. In addition, by using a different light bandwidth pass-filter for each of the two opsistor photodiodes (each pass-filter passing a different bandwidth of light from the other pass-filter), the voltage-phase of the opsistor is rapidly switchable by utilizing small changes in illumination of the two different bandwidths of signaling light matched to the bandwidth response of each of the two opsistor photodiodes.

This characteristic of an opsister with photodiodes that respond to different bandwidths, allows wavelength-controlled switching using a signal-controlled transmitter ("TM2") that produces light signals of the two specified wavelengths at substantially greater transmitter-receiver distances than is possible with standard optocouplers. Applications for the opsistor include long-distance open-air data transmission ("LDOADT") that has high resistance to background noise, and is capable of high data transmission rates; high-speed fiber optic data transmission ("HSFODT") that has high resistance to background noise, and is capable of long-distance and high data transmission rates through non-premium optical fibers; the basic logic and/or memory unit of an optical/electronic based computer; high resolution optical encoders; sensitive edge and target sensors that are useful for image and pattern recognition applications; information transfer when a physical electrical interconnect is not practical such as to and from moving devices, artificial vision retinal stimulation devices that are implanted into the eye of certain blind persons; and virtually any application that can benefit from any and/or all of the following characteristics of an opsistor: high speed, high-sensitivity, high noise resistance, high linear discrimination, and long transmitter-receiver distance.

The opsistor in its most basic form comprises two inverse parallel photodiodes (the "first" and the "second" photodiode) disposed in close proximity preferably as an integrated circuit on a monolithic substrate. The anode of the first photodiode is electrically connected to the cathode of the second photodiode via a common conductor, and the cathode of the first photodiode is electrically connected to the anode of the second photodiode via a second common conductor. Upon light stimulation of both photodiodes, a voltage-phase, either positive or negative, is obtained when measured from the two common conductors of the opsistor. If the light source produces greater illumination of one photodiode than the other, the voltage-phase will be of one direction, and if such illumination is greater for the second photodiode, the voltage-phase will be of the opposite direction. In comparison to the alternating active and passive current states of standard optoelectronic switches, the voltage-phase of the opsistor is actively driven by its two opsistor photodiodes and may occur very rapidly, limited only by parasitic capacitances. An "inactive neutral balanced state" occurs in the absence of light, and an "active neutral balanced state" occurs when the illuminating light source(s) is/are equally stimulating both photodiodes. The two forms of this balance state, in addition to the positive voltage-phase state and the negative voltage-phase state, are employed in applications of the opsistor.

In another embodiment of the present invention (the so-called "OPS-F"), the photodiode subunits of the opsistor are filtered using different bandwidth pass-filters, the "first" and "second" light filters. The voltage-phase of the OPS-F is controllable by varying the illumination balance of the first and second different bandwidths of stimulating light matched to each of the OPS-F photodiode subunits. The first and second bandwidth light sources (hereinafter referred to as "TM2") can include light emitting diodes ("LED"s) and/or lasers either of which are modulated by signal-coding circuitry. The use of different bandwidths of light to switch the OPS-F receiver allows long transmitter-receiver distances, and dimensionally very small OPS-F devices to be signalled.

The applications for the opsistor and OPS-F device of the present invention are many, and include, high-speed optocouplers and optoisolators used for LDOADT and HSFODT; the basic logic and memory subunits of optoelectronic based state machines; optocouplers for information transfer to and from rapidly moving devices; very sensitive optical edge and target detectors; high resolution optical encoders; embedded controllers for micromachines; and an artificial retina disclosed in one of applicants' prior U.S. patent applications (i.e. U.S. patent application Ser. No. 08/642,702 filed Jun. 3, 1996 which is incorporated herein by reference). Such artificial retina devices are designed to restore vision to certain blind individuals by stimulating portions of the retina.

In its use as the receiving unit of a high speed optocoupler, the opsistor is driven by varying the intensity of two transmitter light sources providing signal to the two opsistor photodiodes. This is accomplished by using two LEDs or lasers each positioned over one of the two photodiode subunits, each driven by a signal source. Because each transmitter is closer to one of the opsistor photodiodes, each transmitter will preferentially stimulate the photodiode that it is closest to. In this manner, small variations in the stimulating intensity of the two transmitter light sources, controlled by their signal sources, will cause voltage-phase shifts in the Opsistor which are then identified as the transmitted signal.

DETAILED DESCRIPTION OF THE PREFERRED EMBODIMENTS

Figure 1:
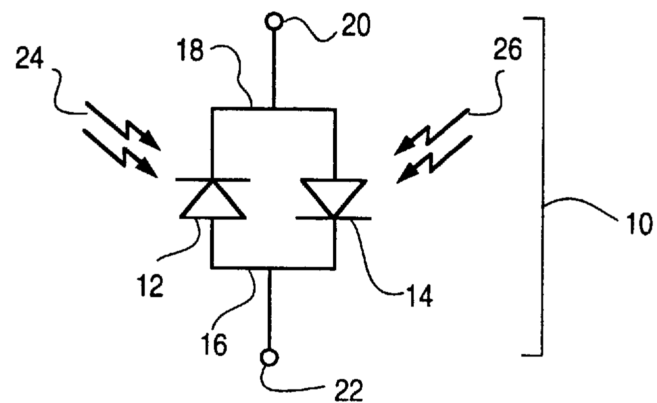
FIG. 1 is a schematic diagram of the basic opsistor according to the first preferred embodiment of the present invention.

The opsistor (10) (FIG. 1) comprises two PIN photodiodes, the first photodiode (12) and the second photodiode (14), electrically connected in an inverse parallel manner such that the anode of the first photodiode (12) is electrically connected to the cathode of the second photodiode (14) via a first common conductor (16), and the cathode of the first photodiode (12) is connected to the anode of the second photodiode (14) via a second common conductor (18). The voltage phase developed by the opsistor (10) is measured from the first output terminal (20) and the second output terminal (22). A first transmitter signal light source (24) to the first photodiode (12) is represented by the arrows (24). A second transmitter signal light source (26) to the second photodiode (14) is represented by the arrows (26). The voltage-phase developed at the output terminals (20,22) is determined by which of the two photodiodes (12,14) produces a higher voltage which is dependent on the relative intensity of illumination they receive from the transmitter signal light sources (24,26). For example if the first photodiode (12) produces a higher voltage than the second photodiode (14), then the voltage phase measured from the first output terminal (20) will be negative and the voltagephase from the second output terminal (22) will be positive. On the other hand, if the voltage from the second photodiode (14) is greater than the voltage from the first photodiode (12), then the voltage-phase measured from the first output terminal (20) will be positive and the voltage-phase measured from the second output terminal (22) will be negative. Thus if the two photodiodes (12,14) are similar or identical as possible, the voltage-phase from the output terminals (20,22) is controlled by relative intensity of illumination of the two photodiodes, i.e. changes in the relative illumination from transmitter signal light sources (24,26) to the two photodiodes (12,14).

Figure 2:
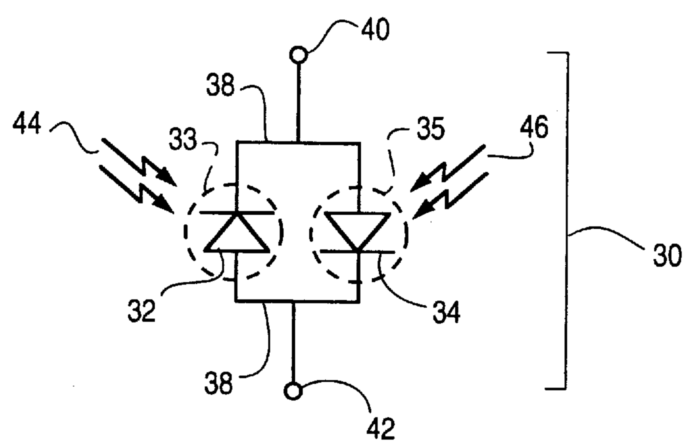
FIG. 2 is a schematic diagram of the OPS-F according to the second preferred embodiment of the present invention.

A preferred embodiment (FIG. 2) is a bandwidth-filtered opsistor ("the OPS-F") (30). The OPS-F (30) comprises two PIN photodiodes (32,34), the first photodiode (32) filtered with the first bandwidth-portion filter (33), and the second photodiode (34) filter with the second bandwidth-portion filter (35), electrically connected in an inverse parallel manner such that the anode of the first photodiode (32) is electrically connected to the cathode of the second photodiode (34) via a first common conductor (36), and the cathode of the first photodiode (32) is connected to the anode of the second photodiode (34) via a second common conductor (38). The first bandwidth-portion filter (33) passes a different bandwidth of transmitter signal light than the second wavelength-portion filter (35). The voltage-phase developed by the OPS-F (30) is measured from the first output terminal (40) and the second output terminal (42). The first bandwidth-portion signal light source ("WPSLS- 1")(44) to the first photodiode (32) is represented by the arrows (44). The second bandwidth-portion signal light source ("WPSLS-2")(46) to the second photodiode (34) is represented by the arrows (46). Because each wavelength-portion filtered photodiode (32, 34) responds only to its own specific bandwidth of light, WPSLS-1 (44) for photodiode (32) and WPSLS-2 (46) for photodiode (34) can be provided from a distant location without cross-talk interference. The term "light" is not restricted to visible light, but also include wavelengths from the far ultraviolet to the far infrared.

The voltage-phase developed at the output terminals (40,42) is determined by which of the two photodiodes (32,34) produces a higher voltage which in turn is dependent on the relative illumination they receive from the transmitter signal light sources, WPSLS-1 (44) and WPSLS-2 (46). For example in FIG. 2, if the first photodiode (32) receives a greater illumination from WPSLS-1 (44) and thus produces a higher voltage than the second photodiode (34) being illuminated by WPSLS-2 (46), then the voltage-phase measured from the first output terminal (40) will be negative and the voltage-phase from the second output terminal (42) will be positive. On the other hand, if the second photodiode (34) receives a greater illumination from WPSLS-2 (46) and thus produces a higher voltage than the first photodiode (32) receiving illumination from WPSLS-1 (44), then the voltage-phase measured from the first output terminal (40) will be positive and the voltage-phase measured from the second output terminal (42) will be negative. Thus if the two photodiodes (32,34) are similar or identical, the voltage-phase from the output terminals (40,42) is controlled by relative illumination and changes in the relative illumination of WPSLS-1 (44) and WPSLS-2 (46) to the two photodiodes (32,34).

Figure 3:
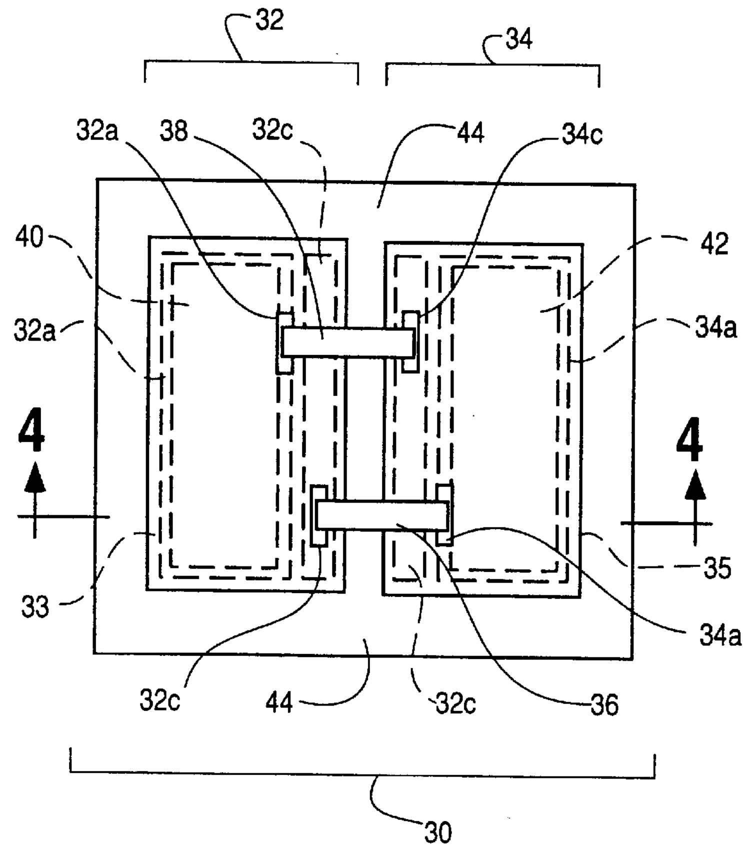
FIG. 3 is a plan view of the OPS-F constructed as a monolithic integrated circuit according to the second preferred embodiment of the present invention.
Figure 4:
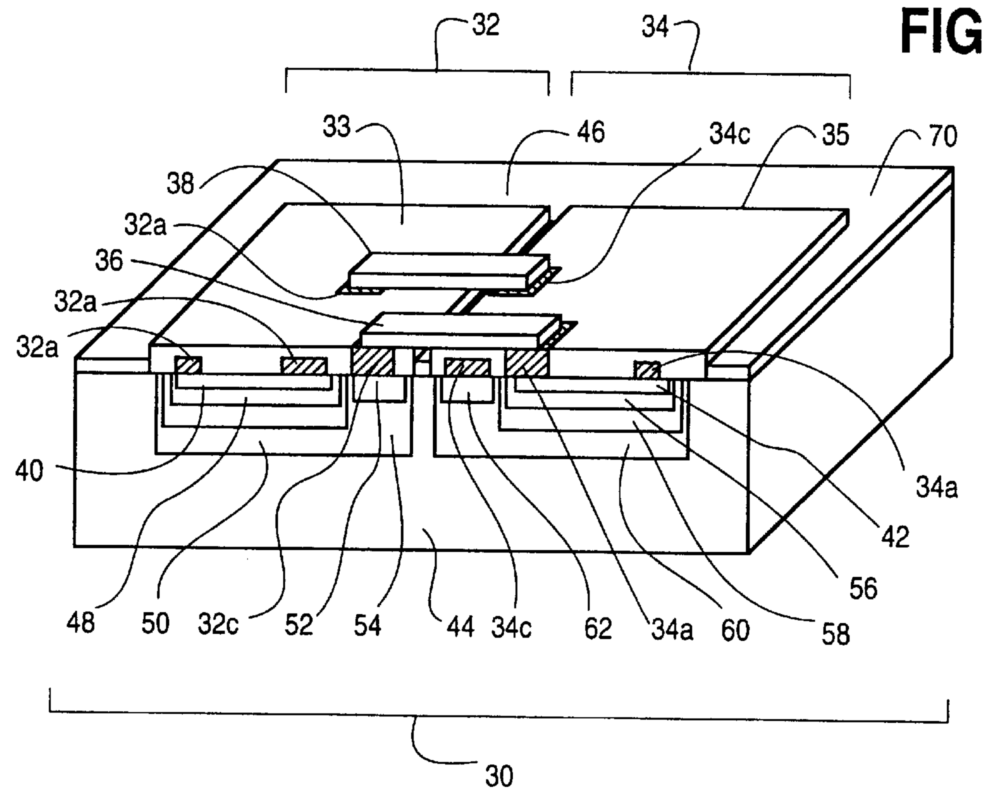
FIG. 4 is a three-dimensional section view of the OPS-F constructed as a monolithic integrated circuit according to the second preferred embodiment of the present invention taken along the plane of line IV—IV of FIG. 3.

Preferably, as shown in FIGS. 3–4, the OPS-F device (30), is constructed as a monolithic integrated circuit. The OPS-F (30) consists of two PIN photodiodes (32,34), the first photodiode (32) filtered with the first bandwidth-portion filter (33), and the second photodiode (34) filter with the second bandwidth-portion filter (35), electrically connected in an inverse parallel manner such that the cathode (**32*c*) of the first photodiode (32) is electrically connected to the anode (34*a*) of the second photodiode (34) via a first common conductor (36), and the anode (32*a*) of the first photodiode (32) is connected to the cathode (34*c*) of the second photodiode (34) via a second common conductor (38). The first bandwidth-portion filter (33) passes a different bandwidth of stimulating light than the second bandwidth-portion filter (35). The voltage-phase developed by the OPS-F (30) is measured from the first common conductor (36) and the second common conductor (38) which are also the output terminals. The voltage-phase developed at the common conductors (36,38) is determined by which of the two photodiodes (32,34**) produces a higher voltage which is dependent on the relative illumination which they receive from their respective signal light sources.

For example if the illumination of the entire OPS-F (30) contains a greater proportion of bandwidths that can stimulate the first photodiode (32) than can stimulate the second photodiode (34), then a higher voltage will be developed by the first photodiode (32) than the second photodiode (34), and the voltage-phase measured from the first common conductor (36) will be negative and the voltage-phase measured from the second common conductor (38) will be positive. On the other hand, if the illumination to the entire OPS-F (30) contains a greater proportion of bandwidths that can stimulate the second photodiode (34) than can stimulate the first photodiode (32), then a higher voltage will be developed by the second photodiode (34) than the first photodiode (32), and the voltage-phase measured from the first common conductor (36) will be positive and the voltage-phase measured from the second common conductor (38) will be negative.

In the preferred embodiment of the OPS-F (30) shown in FIGS. 3–4, the P+ surface (40) of the first photodiode (32) has its anode (**32*a*) deposited around the entire edge of the P+ region (40), and the cathode (32*c*) of the first photodiode (32) is deposited completely over a large area of the N+ region (52) under the cathode (32*c*). Similarly in the preferred embodiment of the OPS-F (30) shown in FIG. 3, the P+ surface (42) of the second photodiode (34) has its anode (34*a*) deposited around the entire edge of its P+ region (42), and the cathode (34*c*) of the second photodiode (34) is deposited completely over a large area of the N+ region (62) under the cathode (34*c*). The starting P-type silicon substrate (44) is shown surrounding the two photodiodes (32, 34). Although, the starting monolithic silicon substrate (44) for the illustrated preferred embodiment of the OPS-F device (30) of the present invention is undoped silicon (44**), those skilled in the art will recognize that P-type or N-type silicon may also be use as a starting monolithic silicon substrate by altering the fabrication of the OPS-F's photodiodes.

As illustrated in FIG. 4, the construction of the OPS-F (30) follows standard semiconductor fabrication processes. PIN photodiodes (32,34) each with a distinct intrinsic layer (50,58) are used in this embodiment because of their higher switching speeds. A first heavily doped N-region (54) and a second heavily doped N-region (60) are fabricated in close proximity to each other in the starting undoped substrate (44). A first N+ region (52), and a second N+ region (62) are then fabricated in the first N-region (54) and the second N-region (60) respectively. A first heavily doped P-region (48) and a second heavily doped P-region (56) are then fabricated in the first N-region (54) and second N-region (60) respectively. A first intrinsic layer (50) then forms at the junction of the P-region (48) and the N-region (54). A second intrinsic layer (58) then forms at the junction of the P-region (56) and the N-region (60). A first P+ region (40) is then fabricated in the first P-region (48), and a second P+ region (42) is then fabricated in the second P-region (56). A first metallic anode (**32*a*) is deposited on the first P+ region (40) on its perimeter to permit a large area of electrical contact and a second metallic anode (34*a*) is deposited on the second P+ region (42) on its perimeter to permit a large area of electrical contact. A first metallic cathode (32*c*) is deposited on the entirety of the first N+ region (52) to permit a large area of electrical contact. A second metallic cathode (34*c*) is deposited on the entirety of the second N+ region (62) to permit a large area of electrical contact. The first wavelength-portion filter (33), which in the preferred embodiment is a multilayer dielectric layer, is deposited on the first photodiode (32). The second wavelength-portion filter (35), which in the preferred embodiment is a multilayer dielectric filter, is deposited on the second photodiode (34**).

Filter layers (33,35) each pass a different bandwidth of light within the spectrum from 450 nm to 1150 nm, the spectral response of the silicon photodiodes. In the preferred embodiment for example, the first filter layer (33) has a bandwidth pass from 600 nm to 850 nm, and the second filter layer (35) has a bandwidth pass from 850 nm to 1100 nm. Those skilled in the art however will recognize that other bandwidths, both longer and shorter, are also useful.

A silicon dioxide insulating layer (70) is fabricated on the areas of the OPS-F (30) not covered by the filter layers (33,35). Openings are etched in filter layers (33,35) to exposed the anodes (32*a*, 34*a*) and the cathodes (32*c*, 34*c*). A first common conductor (36) is then deposited to connect the first cathode (32*c*) to the second anode (34*a*), and a second common conductor (38) is deposited to connect the first anode (32*a*) to the second cathode (34*c*). The common conductors (36,38) also serve as the output terminals (42,40) illustrated in FIG. 2.

Figure 5:
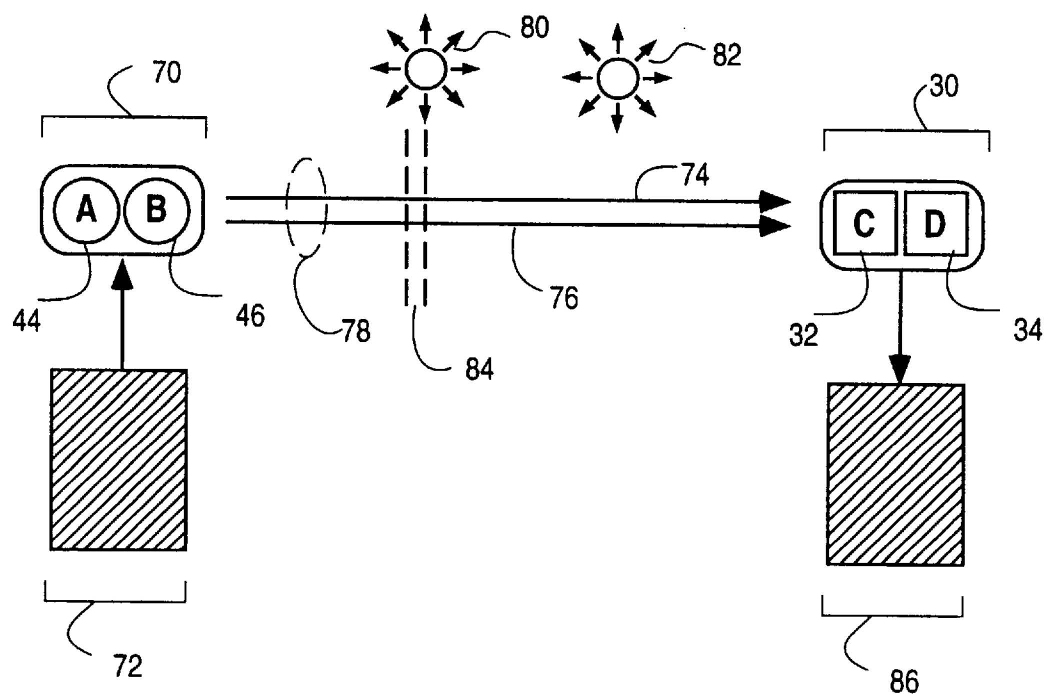
FIG. 5 is a diagram illustrating a TM2/OPS-F combination used for long-distance open-air data transmission ("LDOADT")

FIG. 5 illustrates a TM2/OPS-F combination used for long-distance open-air data transmission ("LDOADT") with characteristic high resistance to background noise, and high data transmission rates. The TM2 (70) is provided signal coding and powered by the transmitter (72). The WPSLS-1 (44) and the WPSLS-2 (46) of the TM2 (70) include LEDs, lasers, or any light source capable of producing specific bandwidths of light in a rapid pulsed manner. The TM2 digital signal (78), comprised of the first bandwidth signal light ("WPSL-1") (74), and the second bandwidth signal light ("WPSL-2") (76), is highly resistant to common mode noise such as ambient light (80), 60 Hz interference (82), and atmospheric attentuations (84). The TM2 signal (78) is sensed by the OPS-F (30) and differentially converted into positive or negative voltage-phase signals by the first photodiode (32) and the second photodiode (34) of the OPS-F (30). The voltage-phase developed by the OPS-F (30) is decoded and reconstructed by a receiver (86) in an industry standard manner.

For LDOADT applications employing the OPS-F embodiment of the opsistor, by utilizing a different light bandwidth filter over each OPS-F receiver opsistor photodiode, the two transmitter light sources of the TM2 (each producing the specified different bandwidths of light) may be located at a great distance from the OPS-F receiver. In addition the OPS-F receiver may receive serial communication even though the OPS-F receiver is in motion, such as if placed on rapidly moving equipment, or even if blocked by a light diffuser such as biological tissue. For example, in the latter case, by using red and infrared light as the two TM2 wavelengths that penetrate the skin into subcutaneous tissues, a subcutaneously implanted OPS-F receiver may receive serial communications via an external TM2 transmitter to provide power and programming to an implanted drug delivery pump.

The advantages of the TM2/OPS-F combination device of this invention for LDOADT are appreciated when compared to the current art for LDOADT. Typically in the current art, a transmission LED is modulated at a carrier frequency approximately 15× higher than the target data rate or baud rate. For example, in remote control and low speed serial PC-IR links, a carrier frequency of about 38 KHz is used to transmit signal bursts to the receiver. The presence of a burst is interpreted as one logic state and the absence its compliment. By timing the signal burst properly in real time, an equivalent data rate of 300 to 2400 baud can be reliably achieved. Newer standards today for PCs have improved this data rate to over 100 kilobits per second but the working distance is just a few feet.

Signal integrity between transmitter and receiver must negotiate ambient light levels and changing attenuation. Even with bandpass filters and signal processing, the transmission rates must be compromised to obtain the required signal to noise margin over background. Signal variations from ambient behave similar to dynamic voltage offsets to the IR carrier signal and can be categorized as "noise." Depending on the receiver circuit, the maximum data rate reliably received is limited by the signal to noise ratio possible, the better the quality of the incoming signal, the faster will be the possible data rate. With open air applications ambient noise is highly dynamic, and ample guardband is reserved to ensure reliable data transmission under all conditions.

Using the TM2/OPS-F transmitter-receiver combination for LDOADT applications, instead of, for example, an intensity amplitude modulated transmitter LED and a single photodiode receiver, the TM2/OPS-F combination uses an active wavelength alternation method utilizing two separate color LEDs for transmitting logic ones and zeros to produce a voltage-phase modulation. This TM2 bi-phasic drive system transmits two wavelengths alternately to produce the effect of a carrier signal at the OPS-F receiver. For example, if GREEN and RED were the two bi-phasic wavelengths, GREEN is ON during the positive excursion of the carrier and RED is ON during the negative excursion of the carrier. These PUSH-PULL excursions are recognized as positive or negative voltage-phases at the OPS-F. This bi-phasic approach forces all ambient factors to become common mode and therefore become automatically canceled at the OPS-F input. Normal signal processing now converts the carrier into a digital data stream. A gain of better than 20 dB in S/N is obtained with the TM2/OPS-F combination. Faster data transmission and longer transmitter-receiver distances are obtainable.

Figure 6:
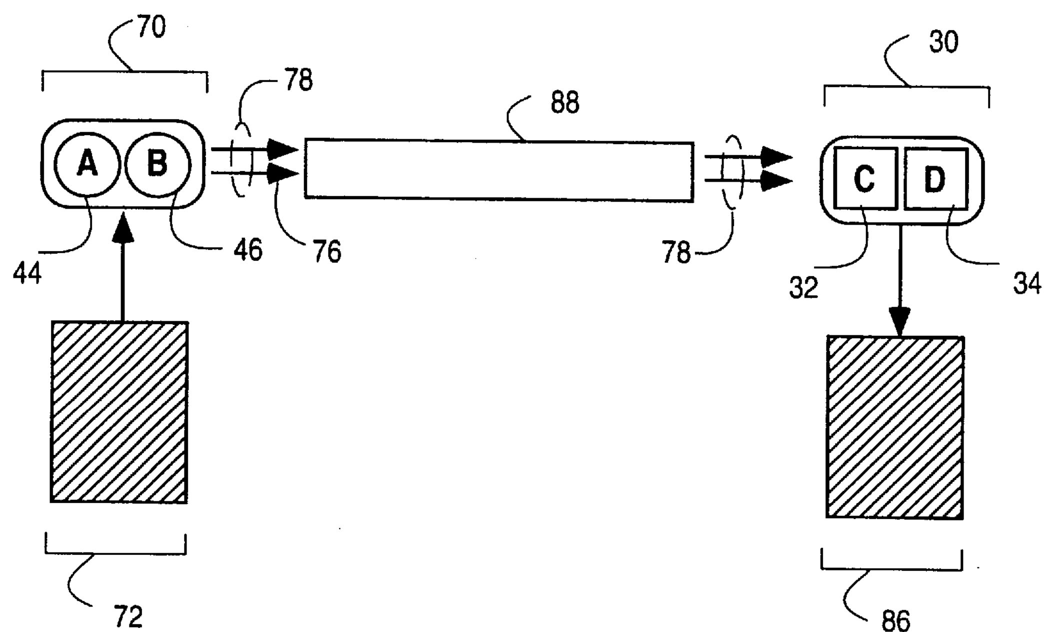
FIG. 6 is a diagram illustrating a TM2/OPS-F combination used in conjunction with a fiber optic for high-speed fiber optic data transmission ("HSFODT")

FIG. 6 illustrates a TM2/OPS-F combination used for High-Speed Fiber Optic Data Transmission ("HSFODT") with characteristic high data transmission rates, and high resistance to fiber attenuations. The TM2 (70) is provided signal coding and powered by the transmitter (72). The WPSLS-1 (44) and the WPSLS-2 (46) of the TM2 (70) include LEDs, lasers, or any light source capable of producing specific bandwidths of light in a rapid pulsed manner. The TM2 digital signal (78) comprised of the first bandwidth signal light ("WPSL-1") (74) and the second bandwidth signal light ("WPSL-2") (76) is highly resistant to fiber attenuations such as from temperature effects, mechanical stress, impurity/defect effects, and water absorption during passage through the conduit optical fiber (88). The TM2 signal (78) is sensed by the OPS-F (30) and differentially converted into positive or negative voltage-phase signals by the first photodiode (32) and the second photodiode (34) of the OPS-F (30). The voltage-phase developed by the OPS-F (30) is decoded and reconstructed by the receiver (86) in an industry standard manner.

The advantages of the HSFODT use of this invention are apparent from comparing it against current art technology. In the current art, a laser source is use to serially transmit monochromatic light signals through an optical fiber to a PiN or avalanche type photodiode detector. Data rates from 20 Mbits/second to Gigabits/second are possible with the proper combination of optics and electronics. With high end applications like telecommunication, factors such as wavelength selection, multimode fibers, low loss connectors, repeaters, and low noise detectors are optimized to achieve the best possible performance. This performance, however, can be further improved if factors such as temperature stress, mechanical stress, and fiber imperfections can be converted into common mode parameters.

By utilizing bi-phasic TM2 drive and OPS-F bi-phasic opsistor detection, the S/N ratio of a fiber link can be improved upon compared to the current art. This increase allows the use of longer span distances between repeaters and/or increased data transmission rates. The majority of noise variables within a fiber are predominantly single-ended or ground referenced. An example is attenuation variations from micro mechanical stresses along a fiber experiencing temperature fluctuations or vibration. The TM2/OPS-F combination used for HSFODT permits balanced signal detection around zero volts. In this approach, a positive voltage vector is a Logic One while a negative voltage vector is a Logic Zero. A DC-coupled amplifier can be used that eliminates many capacitor-related issues (e.g., phase and time delays) for processing ultra-fast signals. Balanced detection also eliminates the need to store a reference voltage (usually by a capacitor) needed to compare input signals against to test for Logic 1 or Logic 0. Higher data transmission rates can be achieved that increase the information bandwidth of a fiber.

With lower technology applications such as computer network fiber links, improvements in the signal-to-noise ratio will allow greater tolerance to fiber imperfections. This in turn can lower fiber cost for consumer applications. One such application may be usage of a lower grade fiber for connection into single family homes that satisfies the required data bandwidth but has higher cost effectiveness.

Figure 7A:
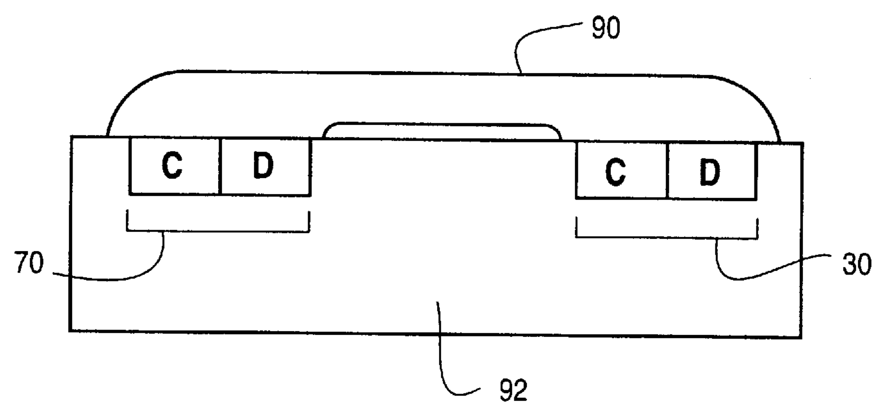
FIG. 7*a* is a cross-sectional diagram of a TM2/OPS-F monolithic optical fiber link used in an optoelectronic based state machine.

FIG. 7*a* is a is a cross-sectional diagram of a TM2/OPS-F monolithic optical fiber link used in an optoelectronic based state machine. The TM2 (70), which preferably is composed of amorphous silicon LEDs, is fabricated within the monolithic silicon substrate (92). Similarly, the OPS-F (30) is also fabricated within the monolithic silicon substrate (92) using techniques standard to the industry. Digital informational data is optically transmitted from a TM2 (70) to a target OPS-F (30) via a micro-optical fiber light conduit (90) fabricated upon the silicon substrate (92) using standard industry techniques.

Figure 7B:
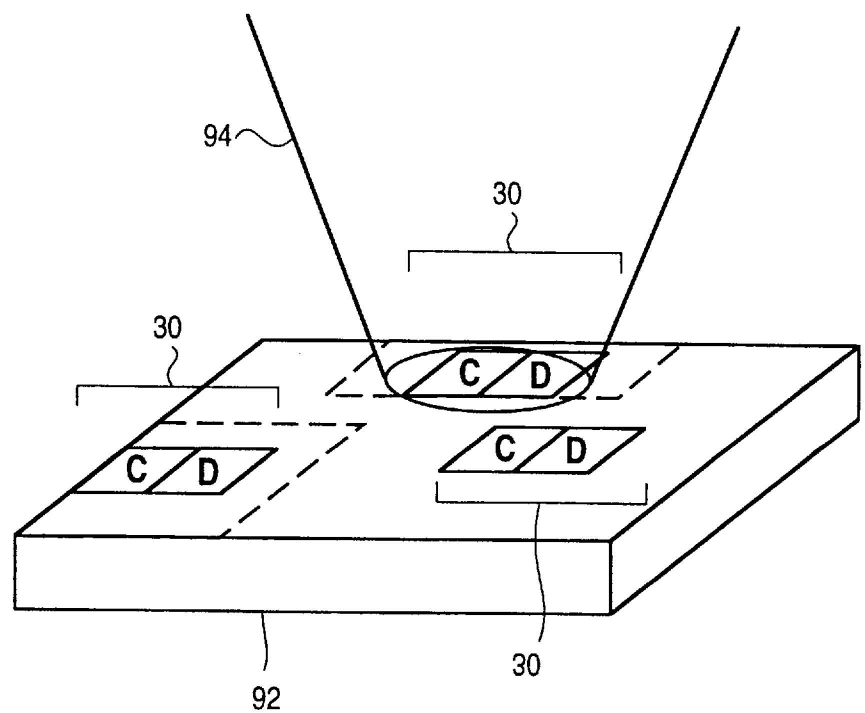
FIG. 7*b* is a diagram illustrating the laser write of a OPS-F disposed as one of a plurality of subunits on a monolithic silicon substrate that is used as the basic switch component of an optoelectronic based state machine, the laser write changing the voltage-phase state of the OPS-F to one of three states of the tri-state OPS-F.

FIG. 7*b* illustrates a laser write of a OPS-F subunit (30*a*) disposed as one of a plurality of OPS-F subunits (30) on a monolithic silicon substrate (92). The OPS-F (30) is used as the basic switch component of an optoelectronic based state machine. Because of direct optical access, the TM2 laser beam (94) can rapidly write changes to the voltage-phase state of a large number of OPS-Fs (30) converting them to one of three OPS-F electrical tri-states.

The OPS-F based optoelectronic state machine functions in the following manner. In general, a state machine performs a specific function determined by its configuration, which can be actively changed. Field programmable logic silicon devices such as gate arrays, and one-time programmable devices are state machines that can be reconfigured to meet many different applications. In the case of a UV-erasable OTP, the computer chip is "dormant" after erasure but becomes functional again after reprogramming. The OPS-F device of this invention also has a "dormant" null state that is analogous to the "OFF" position of a mechanical center-off toggle switch. When OPS-F receiver is activated by TM2 light transmission, the switch can "toggle" to the UP or DOWN position for logic 1 (positive voltage vector) or logic 0 (negative voltage vector) respectively. Once programming is complete, the switch goes back to the center or "OFF" state (ground, 0 volts). This OPS-F tri-sate capability, therefore, allows an OPS-F based optoelectronic state machine to possess three states, represented by a positive voltage vector, a negative voltage vector, and a ground, 0 volts null.

With the OPS-F based optoelectronic state machine, the OPS-F is the input to a configuration FIFO (First In First Out) latch that defines the functionality of that state machine block, or the function of an OPS-F is latched in a high or low logic state which in turn "steers" the processing logic of the state machine. Since the OPS-F normally has a rest state that is not a logic 1 or logic 0, immunity to noise after configuration is very high. By using bi-phasic TM2 light transmission from an external source such as two laser sources or a tunable laser, or from another section of the state machine, the entire state machine can be quickly reprogrammed for functionality as the situation requires. Permitting different optoelectronic blocks to change personality or function on-the-fly minimizes the hardware required for a OPS-F based state machine (vs. traditional microprocessors that are composites of predefined functional blocks). The OPS-F "building block" permits integration of many "smart state machine" blocks based on using bi-phasic TM2 light as the primary link. In this approach, traditional requirements for serial communications, signal multiplexing, and device programming are minimized, since a "smart state machine" block can, for example, change from a "division function" to a "counter function" on-the-fly.

Advantages of such a "smart state machine" block based on the TM2/OPS-F combination over the present art include: (1) faster optocoupler transmission data rates from the active on/active off function, (2) direct laser writes into specific parts of the "smart state machine" to program "smart state machine" blocks circumvents the complexities of serial communications and signal action routing. The steering of the lasers is equivalent to traditional functions of wires and logic clocks resulting in faster operation since silicon elements do not have to be physically close but may be separated, (3) applications in bio-sensor devices where fluids may surround the silicon, and (4) field programmable devices where isolation preservation is important.

Figure 8:
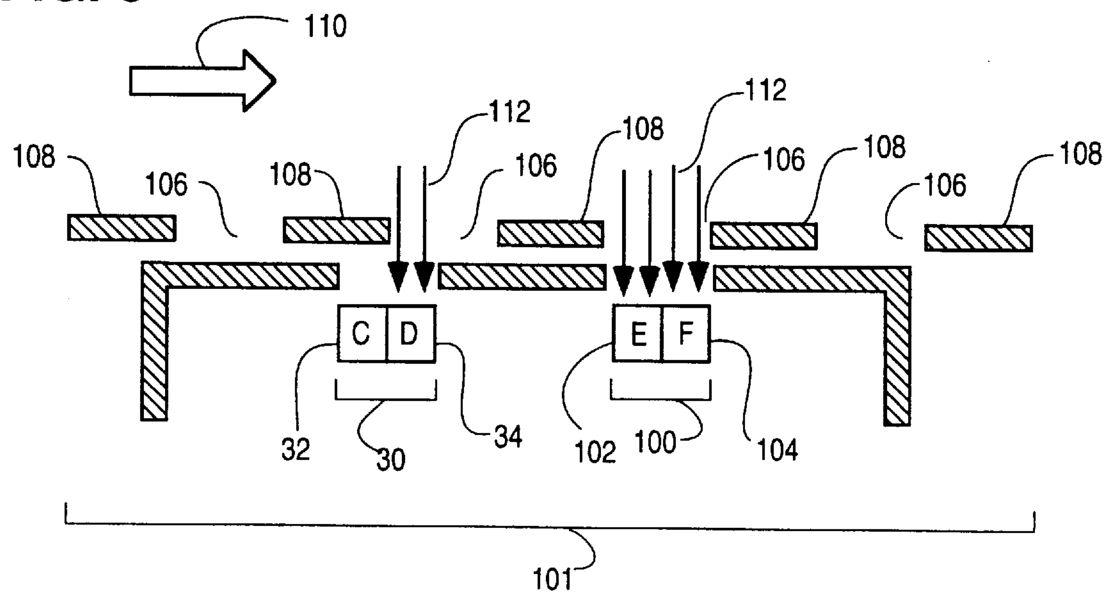
FIG. 8 is a diagram illustrating two opsistors used as the photodetectors in a high-resolution optical encoder.

FIG. 8 (OPTICAL QUADRATURE ENCODER) illustrates the opsistor device of this invention used in place of standard photodiode detectors employed in an optical encoder to double the resolution of the encoder without increasing the slot count of the rotor disk. The photo-sensing portion (101) within an optical encoder utilizing the device of this invention, employs a first opsistor (30) and a second opsistor (100) as the photodetectors. The first opsistor (30) has a first photodiode subunit (32), designated "C", and a second photodiode subunit (34) designated "D". The second opsistor (100) has a first photodiode subunit (102) designated "E", and a second photodiode subunit (104) designated "F". Illumination (112) to the opsistors (30, 100) passes through the rotor slots (106) created between the rotor vanes (108). Movement of the rotor in FIG. 8 is shown by the arrow (110). The 2× resolution quadrature signal of the photo-sensing portion (101) of the opsistor based encoder results because the rotor slots (106) of the optical encoder section (101) are each effectively split into two portions by each of the opsistors (30, 100). As the illumination (112) from the rotor disk slots (106) passes over the first photodiode subunit (32, 102) of either opsistor (30, 100) a voltage-phase in one direction will developed in that respective opsistor. As the illumination (112) from the rotor disk slots (106) continues to move over the entirety of either opsistor surface and illuminates both of the photodiode subunits (32 and 34, or 102 and 104), a voltage-phase null will occur, When the illumination (112) from the rotor disk slots (106) begin to pass preferentially over the second photodiode subunit (34, 104) of either opsistor (30, 100), the voltage-phase will become inverted to the opposite direction. The slot widths (106) are thus functionally split into two portions each. A two-slot, two-opsistor quadrature encoder can achieve twice the resolution of the same encoder using two standard photodiodes.

Figure 9A:
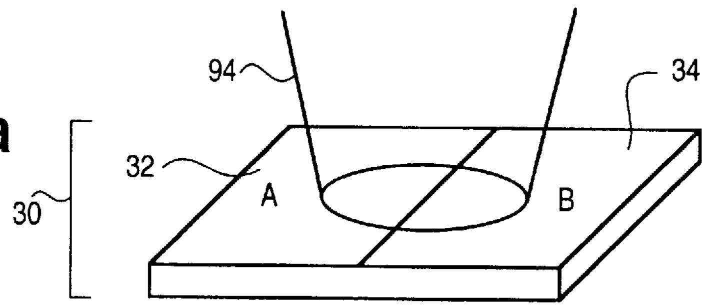
FIGS. 9A–C are diagrams illustrating an opsistor disposed on a monolithic substrate and used as a linear optical position sensor ("LOPS"), a voltage null being produced when the illuminating light spot is equally illuminating both photodiodes of the opsistor, and a voltage-phase in one direction or in the opposite direction occurring as soon as a small misalignment of the light spot occurs that would favor one or the other photodiode subunit of the opsistor.
Figure 9B:
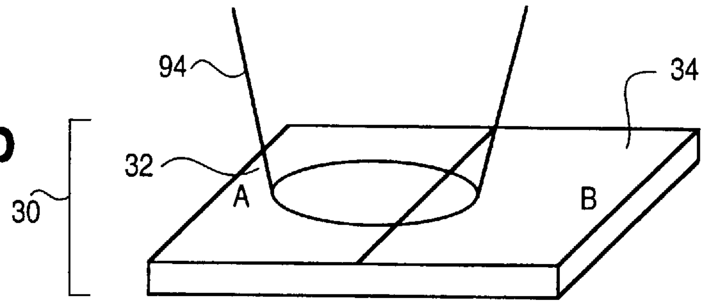
Figure 9C:
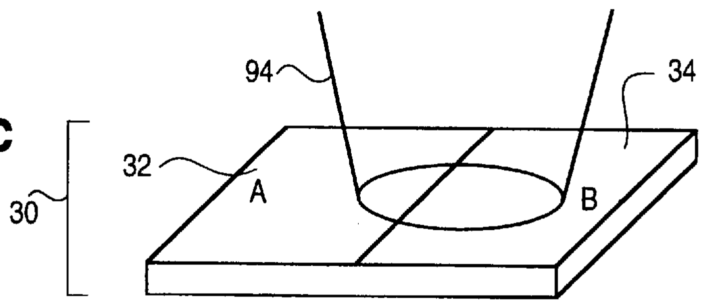

FIGS. 9*a*–9*c* illustrate the opsistor of the present invention used as a precise linear optical position sensor ("LOPS"). In FIG. 9*a*, a null of the voltage-phase develops when the illumination (94) of the two photodiode subunits (32, 34) of the opsistor (30) is equal. A rapid shift of the voltage-phase to positive or negative develops in a flip-flop manner as soon as one of the two opsistor photodiode subunits (32, 34) become preferentially illuminated as shown in FIGS. 9*b* and 9*c*. As the voltage-phase of the opsistor (30) responds to light balance only over its two photodiode subunits (32, 34) which may be fabricated together very closely on a monolithic silicon substrate, the opsistor's rejection of common mode attenuations such as ambient light and temperature effects is high. Uses of a LOPS device such as that shown include micro-beam balances, optical alignment applications, motion sensors, and image recognition devices based on edge detection.

Figure 10:
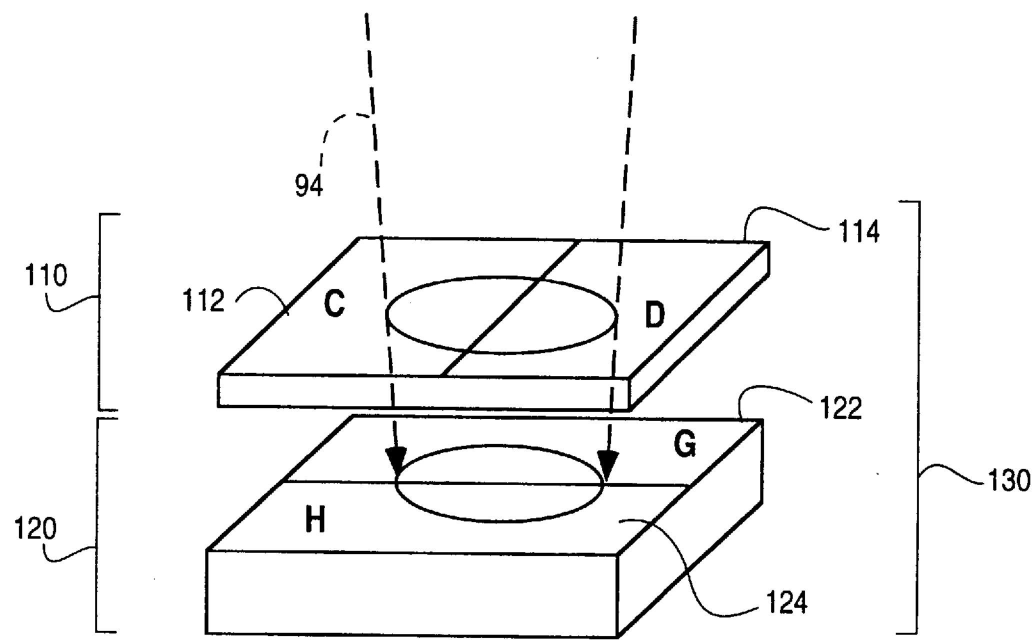
FIG. 10 is a diagram illustrating a first thin substrate opsistor-based LOPS, transparent to the light source being sensed, placed over a second opsistor-based LOPS rotated at 90 degrees relative to the first LOPS to produce a two-dimensional target sensor.

FIG. 10 illustrates a two-dimensional target sensor (130) constructed from two "stacked" LOPS opsistors (110, 120) aligned so that the "top" LOPS opsistor (110), consisting of photodiode subunits (112, 114), which is fabricated within a thin silicon substrate transparent to infrared light, is aligned at 90 degrees rotated from the "bottom" LOPS opsistor (120), consisting of photodiode subunits (122, 124). Such a target sensor (130) uses one LOPS opsistor sensor (110, 120) for each axis of position sensing of a light target (94). Characteristics and quality of such a two-dimensional target sensor (130) include simple fabrication and minimal dead-spot area, in additional to all of the characteristics of the single LOPS sensor. Uses of such a LOPS device include those requiring high precision two-dimensional alignment, weapons targeting, spectrophotometer micro-two-dimensional alignments, and micro-machine/micro-fabrication jig alignment.

We claim:

1. An optoelectronic switch, comprising: two photodiodes such that the anode of one photodiode is electrically connected via a first conductor to the cathode of the second photodiode, and the cathode of the first photodiode is electrically connected via a second conductor to the anode of the second photodiode, wherein the voltage-phase of the first conductor and the second conductor of the optoelectronic switch is a function of which of the photodiodes of the optoelectronic switch receives a greater amount of light illumination.

2. The switch of claim 1 wherein the components of the optoelectronic switch are fabricated on a monolithic substrate.

3. The switch of claim 2 wherein the anodes and the cathodes of the switch are fabricated at its surface.

4. The switch of claim 1 further comprising a dielectric light filter layer used to selectively allow only certain bandwidths of light from 450 nm to 1150 nm, to illuminate each of the photodiodes.

5. The switch of claim 4 wherein the dielectric filter layer is deposited directly on the photoactive surfaces of the photodiodes.

6. The switch of claim 4 wherein the dielectric filter layer allows the same bandwidth of the light spectrum to stimulate both photodiodes of the device.

7. The switch of claim 5 wherein the dielectric filter layer allows different bandwidths of the light spectrum to stimulate each of the photodiodes of the switch.

8. An optoelectronic coupler, for coupling a source of light signals to a receiver that can process voltage-phase signals, comprising:

a light transmitter capable of generating light signals of two different first and second bandwidths;

at least one pair of first and second photodiodes to receive light signals from the light transmitter;

a first conductor electrically connecting the anode of the first photodiode to the cathode of the second photodiode;

a second conductor electrically connecting the cathode of the first photodiode to the anode of the second photodiode;

a first light filter disposed on the photoactive surface of the first photodiode that allows the first bandwidth of light to pass;

a second light filter disposed on the photoactive surface of the second photodiode that allows the second bandwidth of light to pass;

whereby the light transmitter signals utilizing the first and second bandwidths can be converted by said photodiodes into voltage-phase signals across the first and second conductors.

9. The optoelectronic coupler of claim 8 further comprising a modulated signal generator for sending data signals to the light transmitter for transmission to the photodiodes, and a signal receiver for receiving and decoding voltage-phase data from across the first and second conductors.

10. The optoelectronic coupler of claim 8 wherein the light transmitter comprises light emitting diodes.

11. The optoelectronic coupler of claim 8 wherein the light transmitter comprises at least one laser.

12. The optoelectronic coupler of claim 8 wherein the coupler is fabricated on a monolithic silicon substrate and wherein the light transmitter comprises amorphous silicon light emitting diodes fabricated on the same monolithic silicon substrate.

13. A state machine comprising: a plurality of switches each having two photodiodes wherein the anode of one photodiode is electrically connected via a first conductor to the cathode of the second photodiode, and the cathode of the first photodiode is electrically connected via a second conductor to the anode of the second photodiode, wherein the voltage-phase of the first conductor and the second conductor of the optoelectronic switch is a function of which of the photodiodes of the optoelectronic switch receives a greater amount of light illumination; a dielectric light filter layer used to selectively allow only certain bandwidths of light to illuminate each of the photodiodes and wherein the dielectric filter layer allows different bandwidths of the light spectrum to stimulate each of the photodiodes of the switch, each of the switches disposed on a monolithic silicon substrate wherein each switch has three voltage-phases which are activated rapidly by using a mixture of two bandwidths of light; a source of two bandwidths of light for programming the switches by activating one of the three voltage phases; and means to read electronically the combination of voltage states produced by the switches as digital information.

14. The state machine of claim 13 wherein the light source comprises a pair of light emitting diodes for each of the switches, a first member of each light emitting diode pair emitting the first bandwidth of light for programming the plurality of switches, and the second member of each light emitting diode pair emitting the second bandwidth of light for programming the plurality of switches.

15. The state machine of claim 13 wherein the light source comprises a laser.

16. The state machine of claim 15 wherein the laser comprises a tunable laser producing a plurality of different pairs of different wavelengths of light to signal the switches.

17. An optoelectronic position sensor device for determining the location of a light beam, comprising:

a switch having two photodiodes wherein the anode of one photodiode is electrically connected via a first conductor to the cathode of the second photodiode, and the cathode of the first photodiode is electrically connected via a second conductor to the anode of the second photodiode, wherein the voltage-phase of the first conductor and the second conductor of the optoelectronic switch is a function of which of the photodiodes of the optoelectronic switch receives a greater amount of light illumination;

wherein the components of the switch are fabricated on a monolithic substrate and the anodes and the cathodes of the switch are fabricated at its surface;

a focusing lens system to focus the light beam onto the surface of the switch whereby the switch can sense the position of the focused light beam on its surface by producing a positive voltage-phase, negative voltage-phase, or a null zero-volt voltage phase depending upon the balance of illumination of the focused light beam upon the two photodiode components of the switch; and means to electronically analyze the produced voltage-phases so as to indicate the linear position of the light beam on the switch's surface.

18. An optoelectronic sensor for two-dimensional targeting of an object, comprising:

an upper and lower switch each having two Dhotodiodes wherein the anode of one photodiode is electrically connected via a first conductor to the cathode of the second photodiode and the cathode of the first photodiode is electrically connected via a second conductor to the anode of the second photodiode, wherein the voltage-phase of the first conductor and the second conductor of each optoelectronic switch is a function of which of the photodiodes of the optoelectronic switch receives a greater amount of light illumination;

wherein the components of the switch are fabricated on a substrate and the anodes and the cathodes of the switch are fabricated at its surface;

a focusing lens system to focus light from the target object onto the surface of the switch whereby the switch can sense the position of the focused light on its surface by producing a positive voltage-phase, negative voltage-phase, or a null zero-volt voltage phase depending upon the balance of illumination of the focused light upon the two photodiode components of the switch; and means to electronically analyze the produced voltage-phases so as to indicate the linear position of the light on the switch's surface;

wherein the upper switch is fabricated from thinned silicon substrate and the upper switch is substantially transparent to the light from the target object and is oriented at 90 degrees rotated from the lower switch, and that the light from the target object also passes through the substantially transparent upper switch onto the lower switch so that together the two switches function as a two-dimensional target sensor;

and means to electronically analyze the produced voltage-phases of the switches so as to indicate the two-dimensional position of the target object being targeted on the target sensor.

19. An optoelectronic encoder, comprising:

a housing;

a slotted rotor disk inside of the housing;

two switches each switch having two photodiodes such that the anode of one photodiode is electrically connected via a first conductor to the cathode of the second photodiode, and the cathode of the first photodiode is electrically connected via a second conductor to the anode of the second photodiode, wherein the voltage-phase of the first conductor and the second conductor of the switch is a function of which of the photodiodes of the switch receives a greater amount of light illumination;

wherein the components of the switches are fabricated on a monolithic substrate and the anodes and the cathodes of the switch are fabricated at its surface;

and the switches are located inside the housing on one side of the slotted rotor disk;

an encoder light source inside the housing on the other side of the slotted rotor disk;

means for turning the slotted rotor disk, whereby the light pulse signals created from the light source pass through the moving slots of the rotating disk to create voltage-phase changes in the two switches to produce quadrature electrical signals; and means to electronically read the quadrature electrical signals produced.

* * * * *